(12) United States Patent  
Poddar et al.

(10) Patent No.: US 7,838,974 B2  
(45) Date of Patent: Nov. 23, 2010

(54) INTERGRATED CIRCUIT PACKAGING WITH IMPROVED DIE BONDING

(75) Inventors: Anindya Poddar, Sunnyvale, CA (US); Lianxi Shen, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 55 days.

(21) Appl. No.: 12/167,163

(22) Filed: Jul. 2, 2008

(65) Prior Publication Data

US 2009/0072367 A1    Mar. 19, 2009

Related U.S. Application Data

(60) Provisional application No. 60/971,997, filed on Sep. 13, 2007.

(51) Int. Cl.
 *H01L 23/495* (2006.01)

(52) U.S. Cl. ............ 257/676; 257/E23.04; 257/E21.51; 257/773; 257/774; 257/775; 257/776; 257/668; 257/666; 257/670; 257/672

(58) Field of Classification Search .................. 257/676, 257/E23.04, E21.51, 773, 774, 668, 666, 257/775, 776, 672, 671, 670; 438/123
See application file for complete search history.

(56) References Cited

U.S. PATENT DOCUMENTS

| | | | |
|---|---|---|---|
| 6,686,652 B1 | 2/2004 | Bayan et al. | |
| 7,205,180 B1 * | 4/2007 | Sirinorakul et al. | 438/123 |
| 7,227,245 B1 | 6/2007 | Bayan et al. | |
| 2001/0007780 A1 * | 7/2001 | Minamio et al. | 438/106 |
| 2003/0006055 A1 * | 1/2003 | Chien-Hung et al. | 174/52.1 |
| 2005/0167855 A1 * | 8/2005 | Minamio et al. | 257/787 |
| 2005/0263861 A1 * | 12/2005 | Ahn et al. | 257/666 |
| 2006/0001136 A1 * | 1/2006 | Tao et al. | 257/676 |
| 2006/0255438 A1 * | 11/2006 | Omori et al. | 257/670 |
| 2007/0075404 A1 * | 4/2007 | Dimaano et al. | 257/666 |
| 2007/0178630 A1 * | 8/2007 | Huang | 438/116 |
| 2007/0215990 A1 * | 9/2007 | San Antonio et al. | 257/666 |
| 2008/0079127 A1 * | 4/2008 | Gerber | 257/676 |
| 2009/0230521 A2 * | 9/2009 | Zhang et al. | 257/669 |

* cited by examiner

*Primary Examiner*—Alexander O Williams  
(74) *Attorney, Agent, or Firm*—Beyer Law Group LLP (57) ABSTRACT

Particular embodiments of the present invention provide a leadframe suitable for use in packaging IC dice that enables stress reduction in and around the die, die attach material, die attach pad and mold interfaces. More particularly, various leadframes are described that include recesses in selected regions of the top surface of the die attach pad.

16 Claims, 12 Drawing Sheets

INTERGRATED CIRCUIT PACKAGING WITH IMPROVED DIE BONDING

CROSS-REFERENCE TO RELATED APPLICATION

This patent application takes priority under 35 U.S.C. 119(e) to U.S. Provisional Patent Application No. 60/971,997 filed Sep. 13, 2007 and entitled "LEADFRAME," and which is incorporated by reference herein in its entirety for all purposes.

TECHNICAL FIELD

The present invention relates generally to the packaging of integrated circuits (ICs). More particularly, a variety of leadframe designs suitable for use in packaging IC dice are described that facilitate stress reduction in and around an attached die.

BACKGROUND OF THE INVENTION

There are a number of conventional processes for packaging integrated circuit (IC) dice. By way of example, many IC packages utilize a metallic leadframe. The leadframe typically includes a plurality of leads or contacts, and optionally a die attach pad (paddle) upon which a die may be physically attached by means of a suitable adhesive material. The die is typically electrically connected to the leadframe leads by means of bonding wires. In general, the die and portions of the leadframe are encapsulated with a molding material to protect the electrical connections and the delicate electrical components on the active side of the die.

During the encapsulation process, the die, leadframe and other components may be subjected to temperatures reaching and or even exceeding 175° C. before being cooled to room temperature (25° C.). With rapid exposure to such a high temperature, moisture located within the device expands rapidly. Of particular concern is any moisture located in the interface between a die and die attach material and between the die attach material and a die attach pad. In addition to the rapid expansion of moisture, non-uniform expansion as a result of the differences in the coefficients of thermal expansion of the die, die attach material, leadframe and molding material leads to high stresses that can result in delamination, or separation, of the die from its associated die attach pad or paddle (DAP). Additionally, the expansion may result in damaged wire bonds, internal cracks and/or other damage to the die itself. Generally, the risk of delamination or other damage is amplified with decreased heating and cooling times. That is, the faster the device is heated and cooled, the greater the induced stresses and the greater the risk of delamination and other damage.

Other high stress inducing processes include solder reflow and mounting. Additionally, it should be appreciated that thermal variations due to standard device operation induce stresses and that these stresses may also lead to device damage. More particularly, the repetitive powering on and off during standard device operation leads to cyclic stresses that, over extended periods of time, may result in significant damage to the device, such as delamination, and even render the device inoperable.

Hence, there are continuing efforts to reduce stresses and to provide structures that reduce the probability of die delamination and other damage in IC packages.

SUMMARY OF THE INVENTION

In one embodiment, an integrated circuit (IC) package is described. The IC package includes a lead frame including a multiplicity of leads and a die attach pad. The top surface of the die attach pad has a central region and a recessed region that is lower than the central region. A die is adhesively secured to the top surface of the die attach pad and is positioned such that edges of the bottom surface of the die overhang the recessed region of the die attach pad. The thickness of the adhesive is greater under the overhanging edges of the die than in regions of the die secured to the central region of the die attach pad. The described arrangement helps reduce the probability of the die delaminating from the die attach pad during fabrication and/or use of the integrated circuit device.

In another embodiment, a lead frame panel arrangement suitable for use in packaging such devices is described.

In a separate aspect of the invention, a method of depositing a thin metallic film onto a surface of a die attach pad is described. The top surface of the die attach pad is recessed relative to the central region of the die attach pad in regions around the periphery of the die attach pad. A mask is positioned onto the top surface of the die attach pad such that the mask covers all portions of the top surface of the die attach pad that are not recessed. The mask also overhangs portions of the recessed regions. The metal film is then deposited on the recessed region using a conventional deposition technique such as sputtering.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

The present invention relates generally to the packaging of integrated circuits (ICs). More particularly, a variety of leadframe designs suitable for use in packaging IC dice are described that facilitate stress reduction in and around an attached die.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

There are continuing efforts to improve the moisture sensitivity level (MSL) performance of integrated circuit devices, and more generally, to reduce stresses in such devices. As the sizes of IC packages continue to shrink, stress reduction presents an ever increasing challenge. In particular, stresses in and around the die, die attach material and die attach pad interfaces increase as the bond line thickness (BLT) between the die and die attach pad is reduced. More particularly, stress concentrations increase as the thickness of the die attach material is reduced. This is especially relevant in regions around the die, die attach material, die attach pad and mold interfaces. More particularly, the highest concentrations of stresses, including both shear and von misses stresses, are located around the corners, and to a lesser extent the edges, of the die. Thus, by increasing the thickness of the die attach material, the stresses in and around the die and die attach material may be reduced. However, increasing the thickness of the die attach material also makes it more difficult to achieve uniformity in the thickness of the die attach material, and tends to increase the required package thickness.

Figure 1:
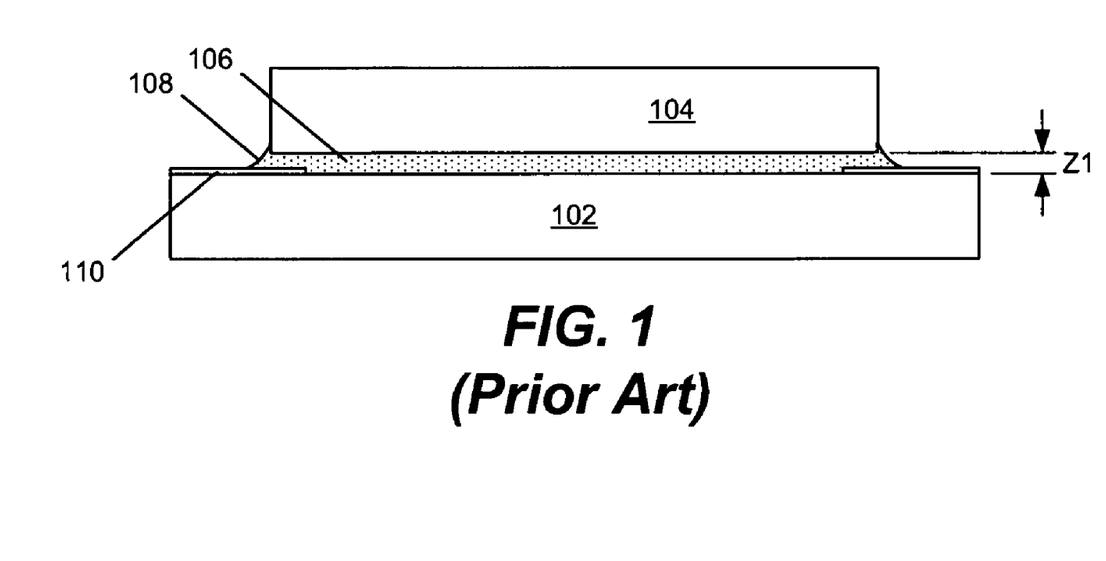
FIG. 1 illustrates a diagrammatic side view of a die attached to a conventional leadframe die attach pad.

FIG. 1 illustrates a cross-sectional view of a conventional die attach pad 102. A die 104 is secured to the die attach pad 102 with an adhesive 106. The thickness Z1 of the adhesive 106 in between the bottom surface of the die 104 and the top surface of the die attach pad 102 is relatively uniform across the entire length of the die 104. Typically, some of the adhesive 106 protrudes out from in between the die 104 and the die attach pad 102. The protruding die attach material may form fillets 108 around the die.

As described above, one method of stress reduction involves increasing the thickness Z1 of the adhesive 106. However, given the rapid and imprecise nature of conventional die attachment, attempts to increase the thickness Z1 of the adhesive 106 often result in a non-uniform thickness of the adhesive between the die 104 and the die attach pad 102. More particularly, one conventional die attachment approach involves placing a glob of adhesive onto the center portion of the top surface of a die attach pad. Subsequently, a die is picked up and positioned onto the glob where it is then pressed onto the glob such that the glue spreads out along the bottom surface of the die and the top surface of the die attach pad. The use of extra glue inherently makes it more difficult to achieve uniformity in the thickness of the adhesive.

It should be appreciated that stress induced delamination and other damage are especially problematic in power packages and packages in which dice are down-bonded to associated die attach pads. Regarding the former, power packages inherently involve higher currents, and hence, are prone to even greater cyclic operational temperature variations and associated stresses.

Regarding the latter, in many applications, it is desirable to downbond or electrically connect bond pads (potentially a larger number) on the active surface of the associated die to the die attach pad. Often in these applications, the die attach pad is grounded or connected to a power supply (although, at least conceptually, a signal may also be routed through the die attach pad). Generally, the bonds pads on the active surface of the die are electrically connected to the die attach pad via gold bonding wires. The leadframe, on the other hand, is often constructed from copper or a copper alloy. In general, gold does not bond well with copper. Therefore, it is often desirable to plate portions of the bonding surfaces of the leadframe with a material such as silver or a silver alloy that bonds better with gold. Ring plating is one process that may be used to deposit the silver or other suitable metallic film onto bonding surfaces of the leadframe. However, due to the imprecision of conventional ring plating processes, the metallic film is often relatively wide. As a result, the die is often positioned over portions of the metallic film. This result has two important consequences. Firstly, the die attach material is even thinner over portions of the die attach pad having metallic film deposited thereon, leading to increased stress concentrations. Secondly, die attach material and molding material generally adhere better to copper than silver, and hence, the presence of the metallic film further increases the likelihood of delamination.

Various embodiments of the present invention will now be described with reference to FIGS. 2-12. Particular embodiments of the present invention provide a leadframe suitable for use in packaging IC dice that facilitates stress reduction in and around the die, die attach material, die attach pad and mold interfaces. More particularly, various leadframes are described that include recesses in selected regions of the top surface of the die attach pad. The recesses are sized and positioned so that edge portions of the die overhang the recesses in the final packaged products.

Figure 2A:
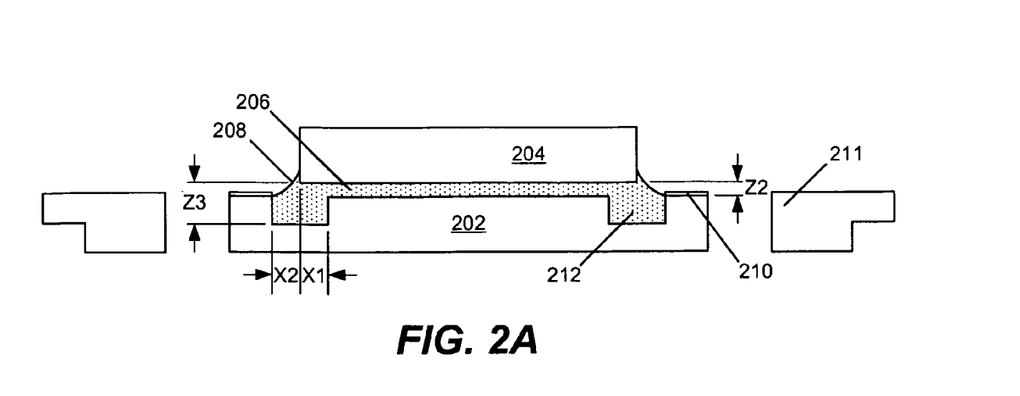
FIGS. 2A-2B illustrate diagrammatic side and top perspective views, respectively, of a die and associated leadframe in accordance with an embodiment of the present invention.
Figure 2B:
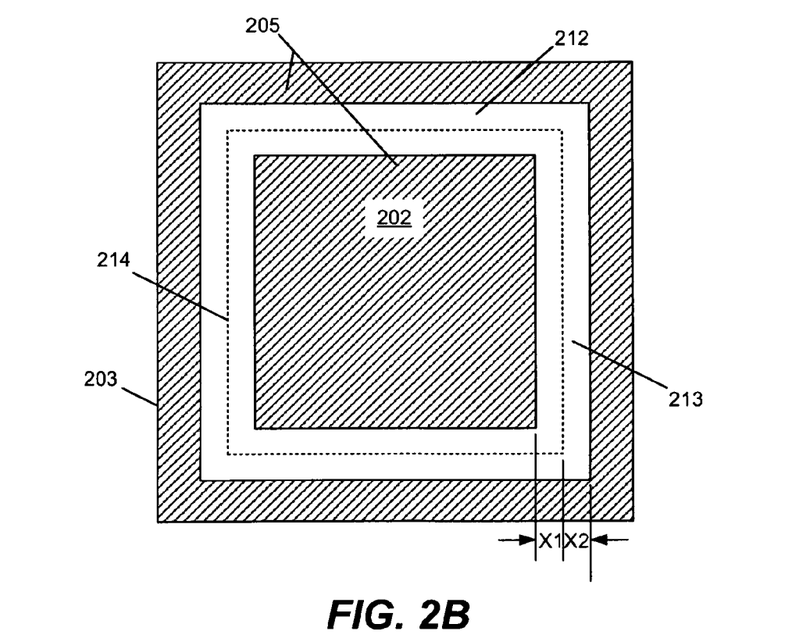

FIGS. 2A-2B illustrate diagrammatic side and top perspective views, respectively, of a leadframe in accordance with one embodiment of the present invention. The leadframe includes a die attach pad 202 and a number of leads 211. The die attach pad 202 is recessed in regions of the top surface 205 of the die attach pad below the edges of an associated die 204. In the illustrated embodiment, the recessed region 212 takes the form of a trough ring 213 that extends below and along the entire perimeter 214 of the associated die 204. The perimeter 214 of the die 204 overhangs the recessed region 212. The amount of overhang (marked X1 in the drawing) may vary based on the needs of a particular package. Additionally, it should be noted that the recessed region 212 extends peripherally beyond the perimeter 214 of the die 204. This gap is labeled X2 in FIGS. 2A and 2B. Some gap is desirable to provide room for a good adhesive fillet to form to the side of the die. The width of the gap may vary widely based on the needs of a particular design.

In the illustrated embodiment, the top surface 205 of the die attach pad 202 is not recessed in regions corresponding to the center of the die attach pad, thereby forming a pedestal that supports the die. Therefore, the thickness (marked Z3) of the die attach material 206 between the bottom surface of the die 204 and the die attach pad 202 over the recessed regions 212 is greater than the thickness (marked Z2) of the die attach material in regions of the die attach pad that are not recessed. A significant advantage of this arrangement is that the thickness of die attach material between the die and the die attach pad is increased in regions where the highest stresses are concentrated, that is, the corners and edges of the die. This helps reduce the probability of delamination. It should be noted that the die attach material 206 extends to at least the outer edges of the die 204, and preferably, the die attach material extends beyond the outer edges of the die to form fillets 208. In various embodiments, the bottom surfaces of the fillets 208 in contact with the die attach pad 202 may or may not extend to the outer peripheral edges of the recessed regions 212. The arrangement also reduces the problems associated with applying generally thicker adhesive layers over the entire surface of the die, thereby facilitating generally thinner packages and reducing the probability of the die being tilted relative to the die attach pad.

The recessed regions 212 (such as trough ring 213 illustrated in FIG. 2B) may be formed by any suitable means such as etching or stamping. In one approach, the recessed regions 212 are etched to a suitable depth in the die attach pad 202 to enable sufficient stress reduction around the die, die attach material, die attach pad and mold interfaces. By way of example, in one embodiment, the die attach pad may be half-etched to produce the recessed regions 212. In this embodiment, the top surface 205 of the die attach pad 202 may be half-etched while concurrently half-etching conventional features into the bottom surface of the die attach pad or the leads 211 of the leadframe. By way of example, the top surface 205 of the die attach pad 202 may be half-etched to produce the recessed regions 212 while portions of the bottom surfaces of various lead frame features such as tie bars, leads 211, or even other portions of the die attach pad are half-etched. In this way, significant time may be saved since an extra processing step to produce the recessed regions 212 is not required. However, it should be appreciated that the recessed regions 212 need not be half-etched as other etching depths may be desirable in particular implementations.

In an alternate embodiment, the recessed regions 212 may be stamped into the die attach pad 202. By way of example, the recessed regions 212 may be stamped to a depth in the range of approximately 12 to 100 microns as measured from the top surface of the die attach pad 202. These depths should work well for leadframes having thicknesses on the order of approximately 150 microns. However, in some applications, deeper or shallower recessed regions may be desired.

Figure 3A:
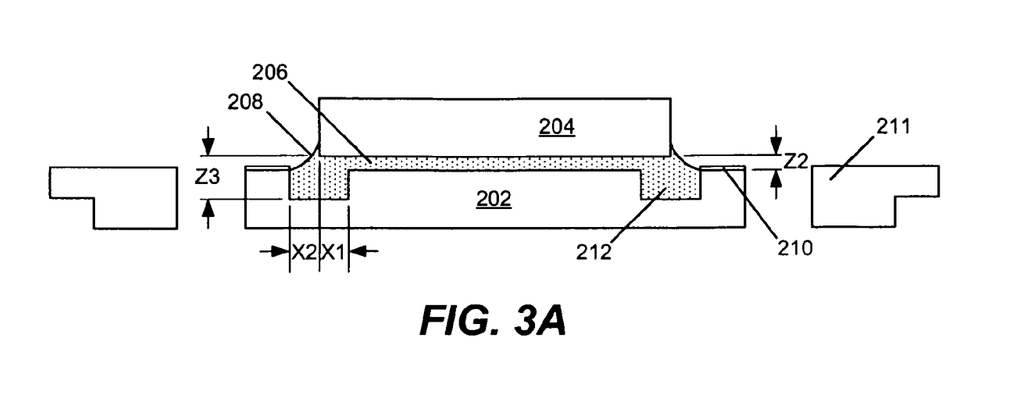
FIGS. 3A-3B illustrate diagrammatic side and top perspective views, respectively, of a die and associated leadframe in accordance with an embodiment of the present invention.
Figure 3B:
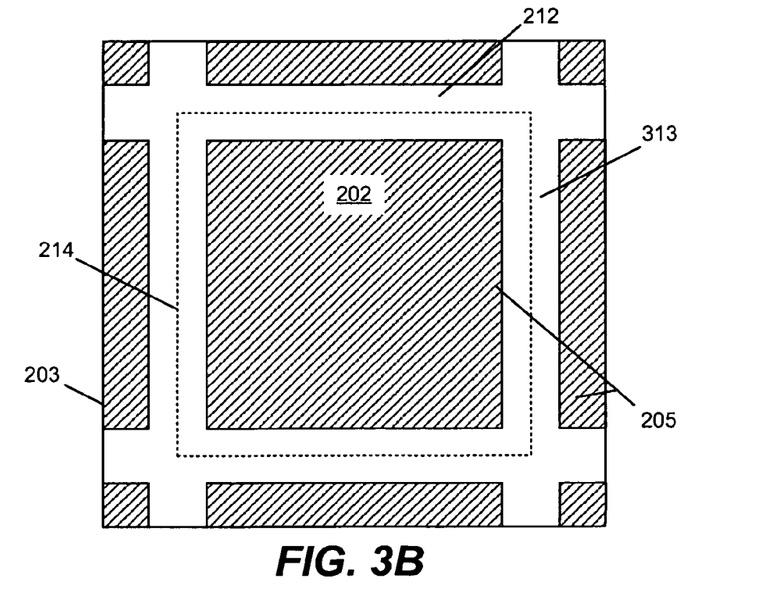

FIGS. 3A-3B illustrate diagrammatic side and top perspective views, respectively, of a leadframe in accordance with another embodiment of the present invention. This embodiment is quite similar to the embodiment described above with respect to FIGS. 2A-2B except that the troughs 313 that form the recessed region 212 extends all the way to the sides of the die attach pad. Such an arrangement permits the troughs 313 to be formed using sawing techniques. The resulting structure is a matrix of troughs that inherently form a trough ring around the outer edges of the die.

Figure 4A:
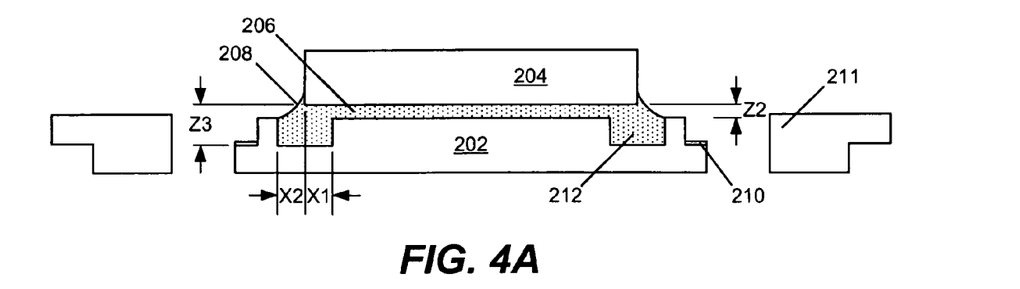
FIGS. 4A-4B illustrate diagrammatic side and top perspective views, respectively, of a die and associated leadframe in accordance with an embodiment of the present invention.
Figure 4B:
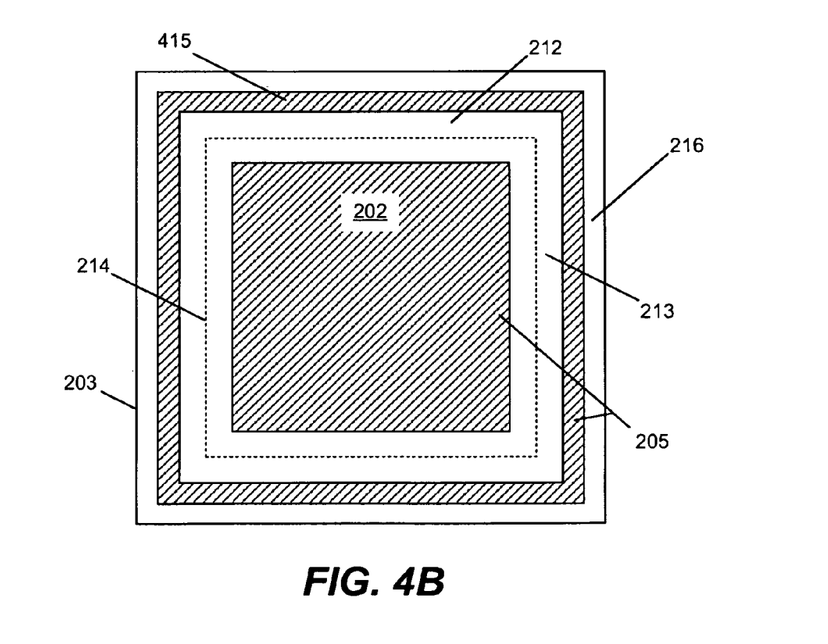

FIGS. 4A-4B illustrate diagrammatic side and top perspective views, respectively, of a leadframe in accordance with another embodiment of the present invention. In the illustrated embodiment, the recessed region 212 again include a trough ring 213 that extends below and along the entire perimeter 214 of the associated die 204. Additionally, the top surface 205 of the die attach pad is also recessed in regions around the periphery of the die attach pad 202. The resulting structure forms a land structure 415 between the trough ring 213 and the peripheral recessed regions 216. In the illustrated embodiment, the peripheral recessed region 216 extends continuously along the entire periphery of the die attach pad 202 therefore forming a peripheral ring. In this embodiment, the land structure 415 takes the form of a land ring. However, this specific geometry is not a requirement as some portions of the periphery of the die attach pad may not be recessed.

The peripheral recessed regions (e.g. the peripheral ring) may be used as a down-bonding surface for the die attach pad. In the illustrated embodiment, the peripheral recessed regions 216 are ring-plated thereby providing a thin metallic film 210 (e.g. a silver film) in the upper surface of the peripheral recessed regions. The ring-plating improves the adhesion of the bonding wires used to electrically connect bond pads on the active surface of the die to the die attach pad 202. The described structure facilitates a new ring plating technique that will be described below.

The width of the peripheral recessed region 216 may vary based on the needs of a particular design. By way of example, widths in the range of approximately 200 to 300 microns are appropriate for many applications. In other embodiments, thinner or wider peripheral recessed regions 216 may be desirable.

The recessed regions 214 and 216 are illustrated as being recessed to the same depth. When etching is used to form the recessed region, such an approach is generally preferred so that both recessed regions can be formed by the same etching process. However, this is not a requirement, particularly when stamping is used to form the recessed regions.

Figure 5A:
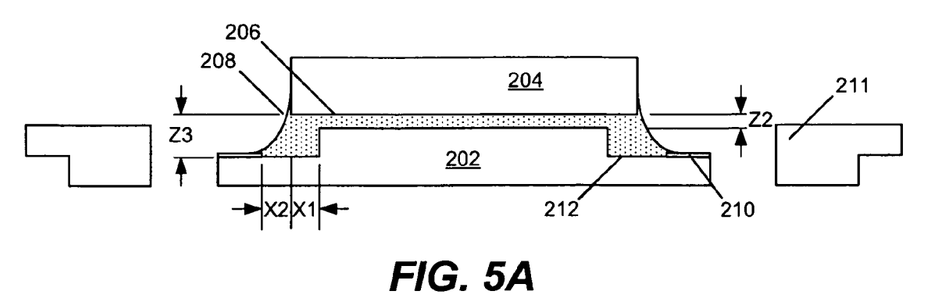
FIGS. 5A-5B illustrate diagrammatic side and top perspective views, respectively, of a die and associated leadframe in accordance with an embodiment of the present invention.
Figure 5B:
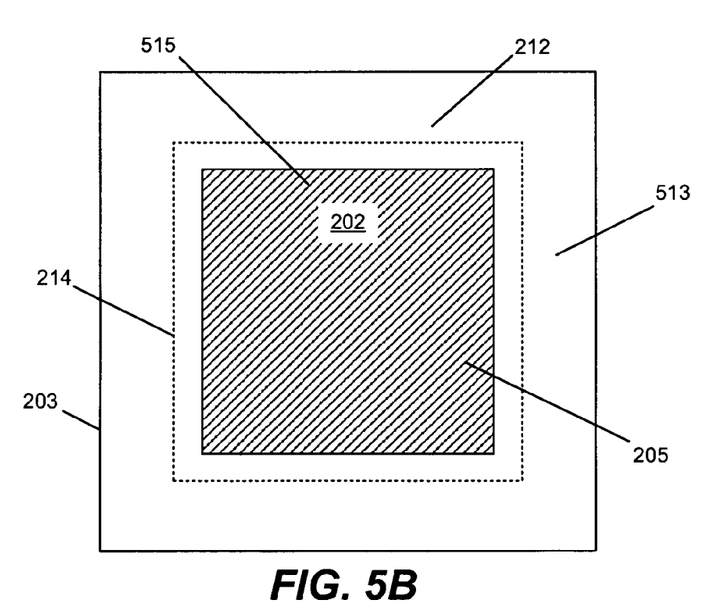

FIGS. 5A-5B illustrate diagrammatic side and top perspective views, respectively, of a leadframe in accordance with yet another embodiment of the present invention. In the illustrated embodiment, the recessed region 212 take the form of a shelf 513 that extends all the way to the side surfaces 203 of the die attach pad 202. The shelf 513 inherently defines a pedestal 515 in a central region of the die attach pad. Like the other embodiments, the die is positioned on the pedestal so that its edges overhang the shelf 513 portion of the die attach pad.

In the embodiments described above, the recesses (e.g. the troughs or shelves) are arranged to underlie the entire length of all of the peripheral edges of the die. This arrangement is generally preferred because stress accumulations tend to be the higher in the edge regions of the die and highest in the regions of the corners of the die. In some cases, it may not be desirable or practical to create recesses in the die attach pad that facilitate overhanging all edges of the die. Since the highest stress concentrations tend to be in the corner regions of the die, some benefit can be obtained by overhanging the corners of the die.

Figure 6A:
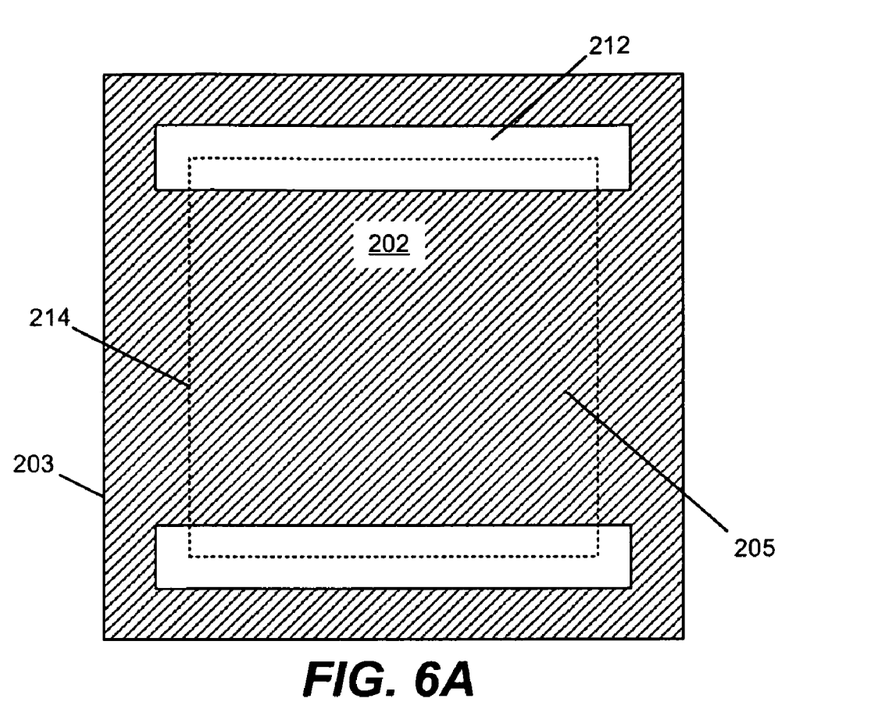
FIGS. 6A-6B illustrate diagrammatic top perspective views of leadframes in accordance with an embodiment of the present invention.

FIG. 6A illustrates an alternative embodiment in which the die attach pad 202 includes two recessed regions 212. The recessed regions 212 are located in the top surface 205 of the die attach pad 202 along portions of the die attach pad that correspond to opposite side edges of associated die 204.

Figure 6B:
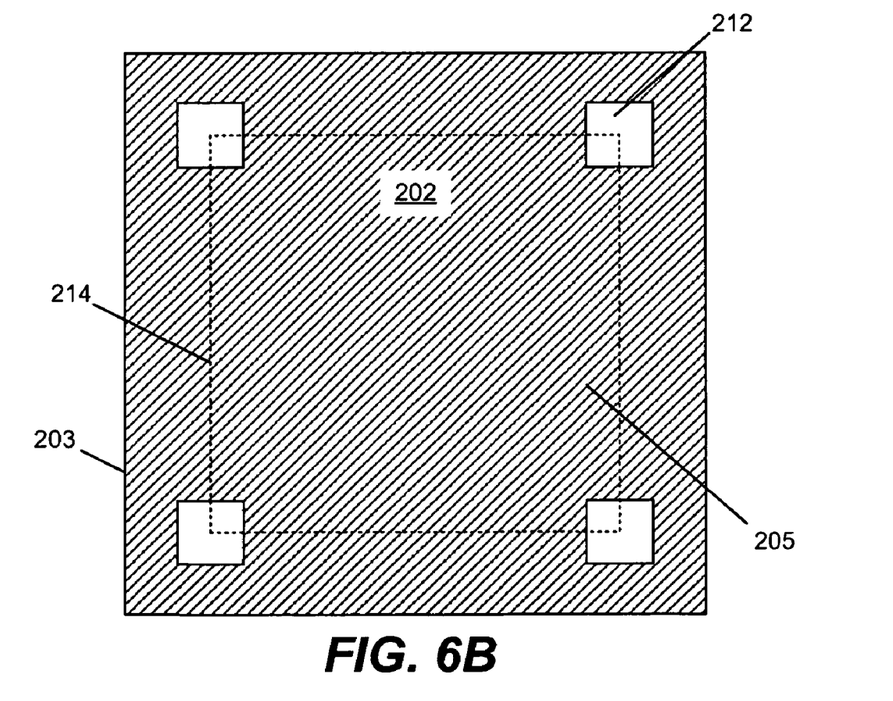

FIG. 6B illustrates yet another embodiment. In this embodiment only regions of the die attach pad 202 below corners of the die 204 are recessed. In this embodiment, the four recessed regions 212 are substantially rectangular as viewed from above. It should be appreciated that the geometry of the recessed regions may be varied widely and there is no need that the recessed regions 212 be rectangular. Rather, the recessed regions 212 may take any suitable form including substantially square, circular, ovular, or any other suitable shape.

It should be apparent that the invention should not be limited to the recess geometries described above. Rather, other recessed region geometries are permitted within the scope of the present invention.

Figure 7A:
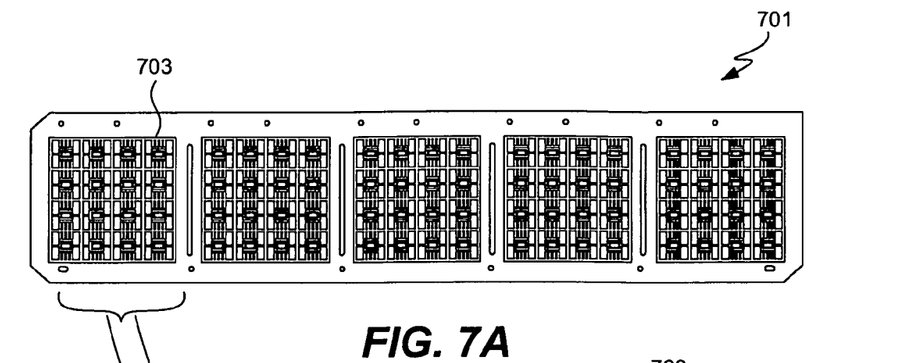
FIGS. 7A-7C illustrate diagrammatic top views of a lead frame panel suitable for packaging IC dice in accordance with an embodiment of the present invention.
Figure 7B:
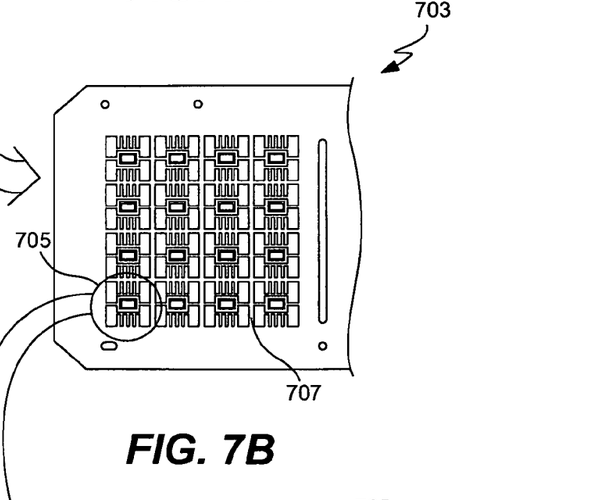
Figure 7C:
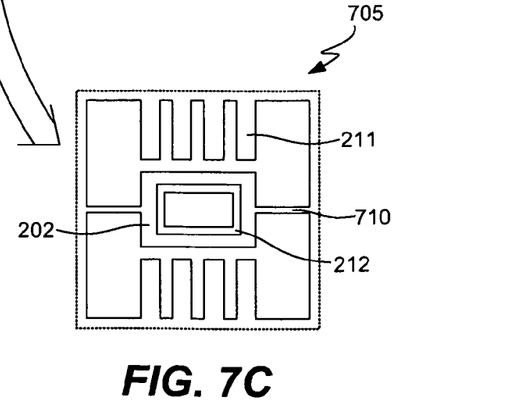

It should be appreciated that the die attach pad 202 and associated surrounding leads will generally be components of a single device area in a leadframe panel that includes a large number of device areas, each device area being configured for use in a single IC package. An example leadframe panel 701 suitable for use in packaging integrated circuits according to various embodiments of the present invention will now be described with reference to FIGS. 7A-7C. FIG. 7A illustrates a diagrammatic top view of a lead frame panel 701 arranged in the form of a strip. The lead frame panel 701 can be configured as a metallic structure with a number of two-dimensional arrays 703 of device areas. As illustrated in the successively more detailed FIGS. 7B-7C, each two-dimensional array 703 includes a plurality of device areas 705 each connected by fine tie bars 707. Each device area 705 includes a die attach pad 202 having recessed regions 212 in a top surface thereof. Each die attach pad 202 is supported by the tie bars 707 via die attach pad supporting bars 710. Additionally, each device area 705 includes a number of leads 211, each supported at one end by the tie bars 707. Additionally, portions of the bottom surfaces of the die attach pad 202 and leads 211 may also be half-etched so as to provide locking features or other desirable features.

It will be appreciated by those skilled in the art that, although a specific leadframe panel 701 has been described and illustrated, the recessed regions of the present invention may be employed in packaging dice utilizing an extremely wide variety of other lead frame panels or strip configurations as well. Additionally, although described with reference to a bottom surface of the lead frame panel 701, it should be appreciated that this context is intended solely for use in describing the structure and in no way defines or limits the orientation of the leadframe for subsequent attachment to a printed circuit board (PCB).

Figure 8:
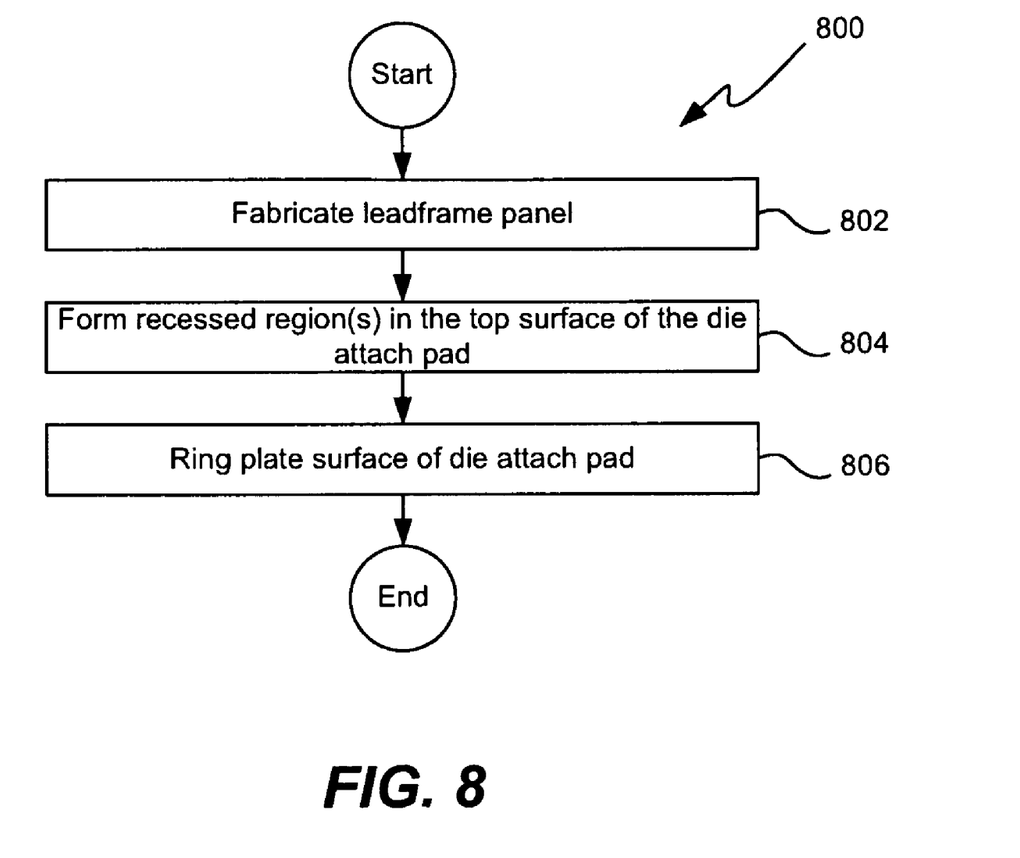
FIG. 8 is a flow chart illustrating a process for producing a leadframe suitable for use in accordance with an embodiment of the present invention.

With reference to FIG. 8, a process 800 of producing a leadframe in accordance with various embodiments of the present invention will be described. Initially, a leadframe panel is fabricated 802 that includes a die attach pad and a plurality of leads. The die attach pad, leads and other features of the leadframe are generally produced as a result of etching or stamping a metallic (typically copper) sheet.

One or more recessed regions are then formed 804 in the top surface of the die attach pad. By way of example, the recessed regions may be formed by etching or stamping the die attach pad. The recessed regions are formed in portions of the top surface of the die attach pad below corresponding edges of an associated die to be attached to the die attach pad. It should be appreciated that, in a preferred embodiment, the recessed regions may be formed in the top surface of the die attach pad while other features are concurrently formed in the bottom surface of the leadframe.

In some applications, it is desirable to electrically connect the die attach pad to bond pads on the active surface of an associated die. To facilitate electrical connection to the die attach pad, surfaces of the die attach pad may be ring plated 806. Conventionally, ring plating is accomplished through sputtering a thin film (ring) of metal around a mechanical mask, although other suitable processes may be used. The mechanical mask is positioned onto the top surface of the die attach pad. As viewed from above, the mechanical mask may assume a variety of geometrical shapes including square, rectangular, and circular, among others.

Figure 9:
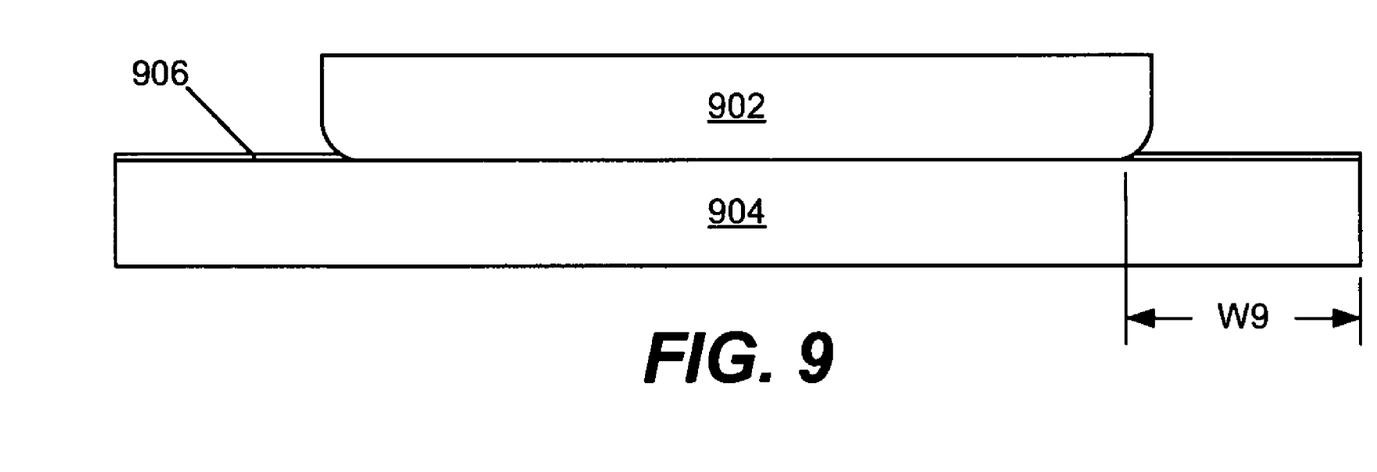
FIG. 9 illustrates a diagrammatic side view of a conventional mechanical mask suitable for use in ring plating.

A diagrammatic side view of an example of a conventional mechanical mask 902 is illustrated in FIG. 9. The mask 902 is generally positioned onto the top surface of a die attach pad 904 such that the mask is centered onto the die attach pad. The ring material (e.g., silver or silver alloy) is then sputtered onto the die attach pad 904. The mask 902 prevents the deposition of ring material onto areas of the die attach pad 904 covered by the mask. In this way, a thin film 906 of ring material is formed around the mask 902 that corresponds to the geometry of the perimeter of the mask. The thickness of the ring 906 is relatively small compared to other features of the die attach pad. The width W9 of the ring 906 is dependent upon the size of the mask 902 relative to the size of the die attach pad 904. Conventionally, the width of the ring 906 may be as wide as or even wider than approximately 25 mils. Additionally, the imprecision of the apparatus used to position the mask 902 onto the die attach pad 904 may result in variations in the width W9 of the ring 906 on opposite sides of the mask. By way of example, this error may be as large as or larger than approximately 4 mils. This translates to a difference in ring widths on opposite sides of the die attach pad 904 of approximately 8 mils.

Thus, the imprecise nature of conventional ring plating results in both wide and non-uniform ring widths. It should be noted that wide ring widths may represent a significant contributor to package delamination. More particularly, as a result of surface chemistry, the likelihood of delamination between the die attach pad and molding or die attach material is increased over the silver ring-plated portions of the die attach pad as compared to over the copper portions of the die attach pad.

Figure 10:
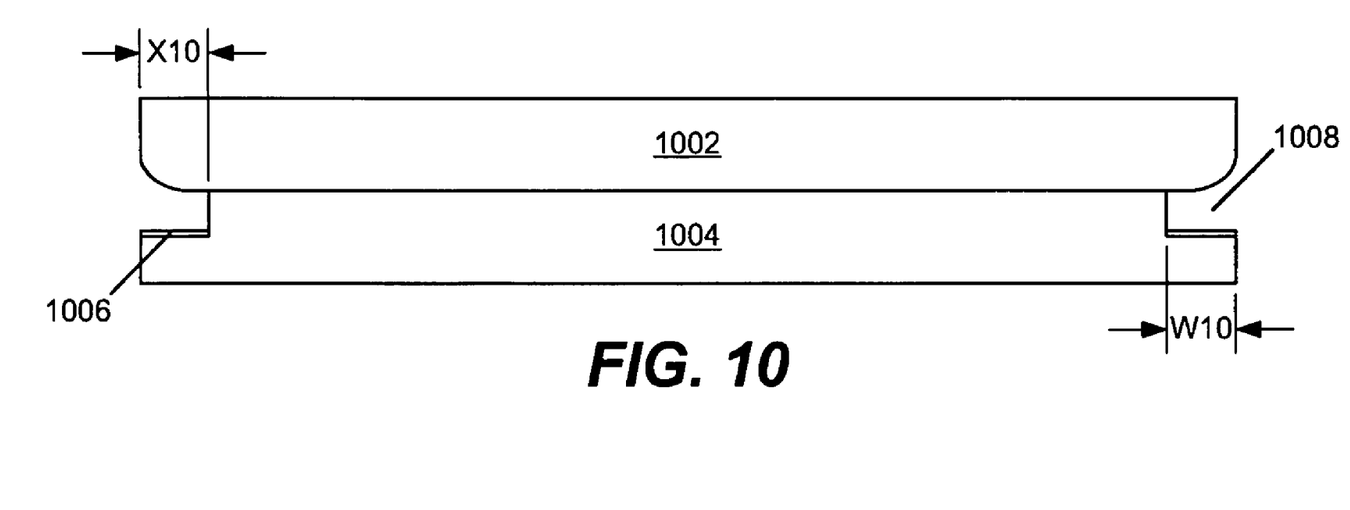
FIG. 10 illustrates a diagrammatic side view of a relatively oversized mechanical mask suitable for ring plating in accordance with an embodiment of the present invention.

FIG. 10 illustrates a relatively oversized mechanical mask 1002 suitable for use in ring plating a die attach pad 1004 of a leadframe in accordance with a separate aspect of the present invention. It should be appreciated that, although not illustrated, the lead frame generally includes a plurality of leads that surround sides of the die attach pad 1004. As seen in FIG. 10, the die attach pad 1004 includes a peripheral recessed region 1008. In one embodiment, the peripheral recessed region 1008 surrounds the entire periphery of the die attach pad 1004. The width (W10) of the peripheral recessed region 1008 may be in the range of approximately 200-300 microns (or 8-12 mils). In other embodiments, the width W10 may be larger or smaller. In a particular embodiment, the width W10 is approximately equal to 250 microns. It should be noted that the mechanical mask 1002 overhangs the ring plating region 1008 (marked X10 in the drawing). That is, the mask is larger than the area to be protected from the ring plating. The amount of overhang may vary, but by way of example, overhangs of up to approximately 300 microns appear to be suitable. In some circumstances, the mask overhang (X10) may be larger than the width (W10) of the peripheral recessed region 1008 such that the mask 1002 eclipses or overhangs the entire die attach pad 1004.

The ring plating regions 1008 are recessed relative to the top surface of the die attach pad 1004 to allow sputtered metallic material (e.g., silver, silver alloy, or another suitable material) to deposit below the oversized mechanical mask 1002 such that a thin film ring 1006 of ring material may be formed over the peripheral recessed regions 1008. The depth of the recessed regions may vary widely, but by way of example, the recessed regions 1008 may be recessed to a depth in the range of 25 to 100 microns in some applications. It should be appreciated that the width of the ring 1006 is generally solely a function of the width W10 of the peripheral recessed region 1008. That is, as long as sputtered ring material can deposit onto all portions of the peripheral recessed region 1008, then the width of the thin film metallic ring 1006 will be equal to the width W10 of the peripheral recessed region. However, it should be appreciated that the ability of the sputtered material to penetrate the gap between the mask and the shelf would limit the width of the ring in situations where the overhang is too wide.

Two particular advantages of such an arrangement of a relatively oversized mechanical mask 1002 and recessed die attach pad 1004 are 1) the width of the ring 1006 may be precisely controlled; and 2) the width of the ring may be made quite uniform around the die attach pad, as compared with conventional ring plating. These advantages result from the fact that the width of the peripheral recessed ring plating region 1008 may be controlled to within an etch or stamp tolerance that may be significantly smaller than the position tolerance of the apparatus used to position the mask 1002 onto the die attach pad 1004. By way of example, the etch tolerance may be less than approximately 50 microns compared to a positioning tolerance (of a conventional mask positioning apparatus) of approximately 100 microns.

Additionally, it should be noted that, in one embodiment, the die attach pad 1004 includes recessed regions 212 as described above with reference to particular embodiments illustrated in FIGS. 2-7. It should be appreciated that the peripheral recessed regions 1008 may be formed in conjunction with forming the recessed regions 212. That is, the regions 1008 and 212 may be formed substantially simultaneously via etching or stamping or may be formed as the same shelf. It should be noted, however, that in various embodiments, the oversized mask 1002 may also be used to ring plate a die attach pad 1004 that is intended to be used with a die that does not overhang the shelf 1008.

Figure 11:
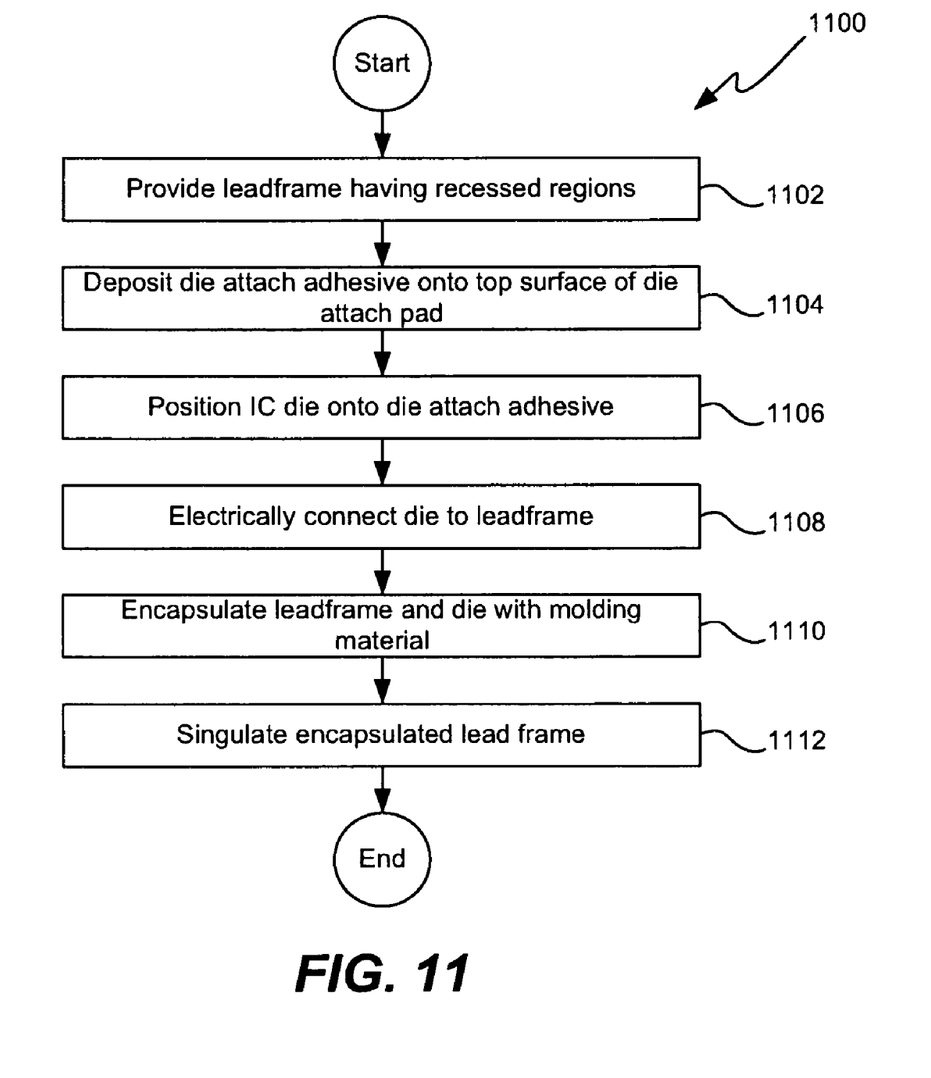
FIG. 11 is a flow chart illustrating a process for packaging IC dice in accordance with an embodiment of the present invention.

With reference to FIG. 11, a process 1100 of packaging IC dice in accordance with various embodiments of the present invention will be described. Initially, a leadframe including a die attach pad having recessed regions is provided 1102. Preferably, the recessed regions are formed in at least portions of the die attach pad corresponding to corners of an associated die to be attached to the die attach pad. A suitable die attach material (adhesive) is deposited 1104 onto a top surface of the die attach pad. An IC die may then be positioned 1106 onto the die attach adhesive. The die is pressed onto the die attach adhesive such that the die attach adhesive spreads out between the bottom surface of the die and the top surface of the die attach pad. Preferably an ample volume of die attach material is deposited such that the die attach material substantially fills at least portions of the recessed regions while maintaining a suitable die attach material thickness between the die and non-recessed portions of the die attach pad. It should be noted that after pressing the die onto the die attach adhesive, the die attach adhesive extends to at least the outer edges of the die, and preferably, the die attach material extends beyond the outer edges of the die to form fillets of die attach material at the outer edges of the die.

Bonds pads on the active surface of the die may then be electrically connected 1108 to top surfaces of the leads of the leadframe. Additionally, a number of the bond pads may be downbonded to the top surface of the die attach pad. The bonds pads may be electrically connected to the leads and die attach pad with any suitable means. In one embodiment, bonding wires are used to connect the bond pads to the leads and die attach pad Portions of the leadframe and attached die may then be encapsulated 1110 with a conventional molding material. The molding material is generally a non-conductive plastic having a low coefficient of thermal expansion. In a preferred embodiment, an entire populated lead frame strip, such as lead frame panel 701, is placed in the mold such that all of the devices areas on the panel may be encapsulated substantially simultaneously. It should be appreciated that a lesser number of dice may also be encapsulated at any one time, and that the structure of the lead frame should in no way limit the scope of the present invention. It should be appreciated that any suitable molding system may be used to encapsulate the attached dice.

Figure 12:
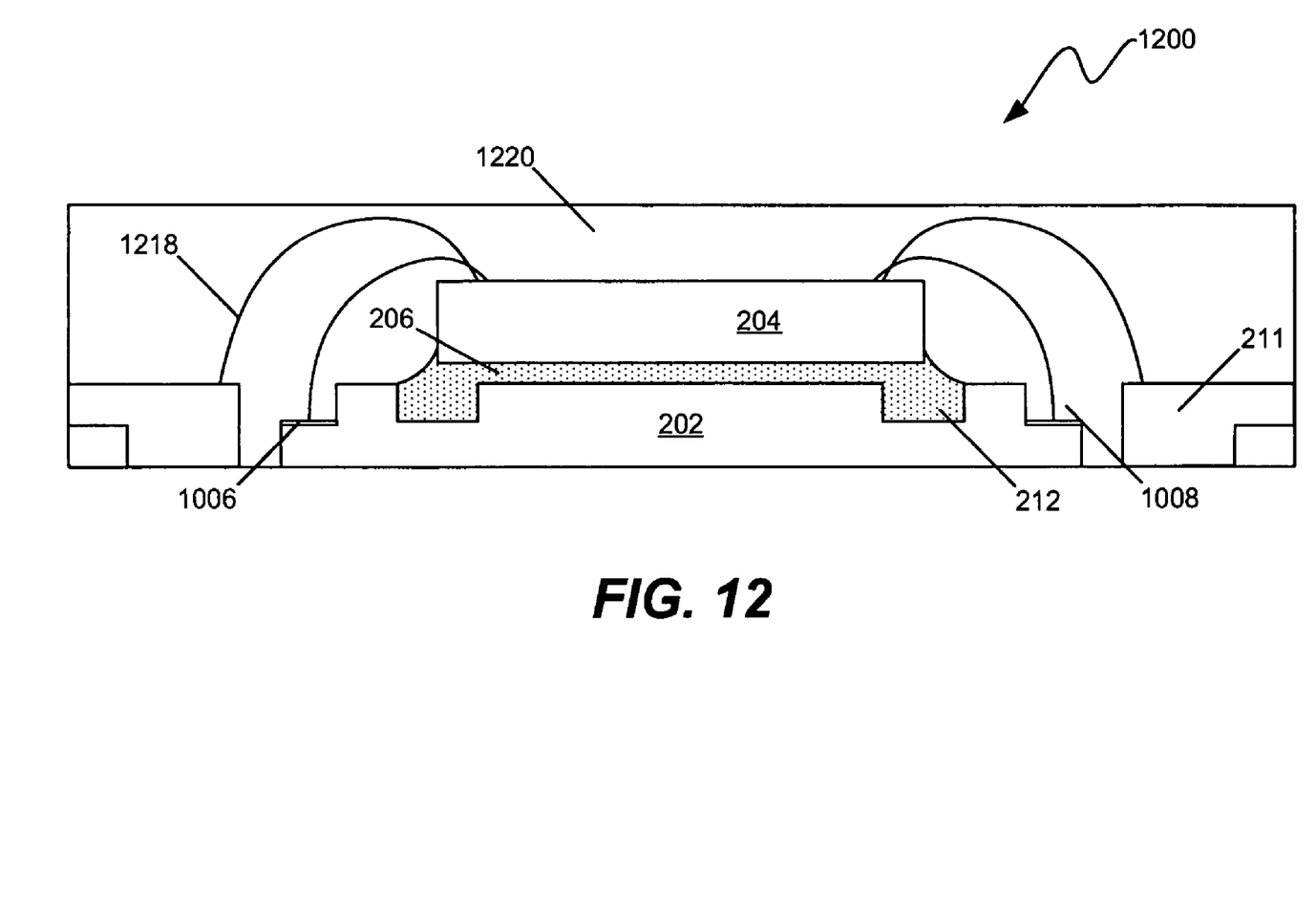
FIG. 12 illustrates a diagrammatic side view of an IC package in accordance with an embodiment of the present invention.

After curing the molding material, the encapsulated lead frame may then be singulated 1112, if necessary, to yield a plurality of individual IC packages. An example of one such package is illustrated in FIG. 12. The encapsulated lead frame may be singulated with any suitable means. By way of example, the lead frame may be sawed to produce individual IC packages. Upon package singulation, the exposed IC packages may be attached to PCBs or other desired substrates.

The package 1200 includes die attach pad 202 having recessed regions 212 and a peripheral recessed ring plating region 1008. A die 204 is attached to the die attach pad 202 with die attach adhesive 206. The active surface of the die 204 is electrically connected to leads 211 and metallic ring 1006 via bonding wires 1218. Lastly, molding material 1220 surrounds portions of the die 204, leads 211 and die attach pad 202.

Particular embodiments described above enable significant stress reduction while simultaneously allowing the use of standard die attach processes and equipment without penalty of a drop in units per hour or increased setup time. By way of example, computer simulation results show significant stress reduction, including both shear and Von misses stresses, while incorporating embodiments of the present invention.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
   a lead frame including a multiplicity of leads and a die attach pad, the die attach pad having a top surface and a bottom surface, wherein the top surface of the die attach pad has a central region and a recessed region that is lower than the central region;
   a die including an active surface, a bottom surface substantially opposite the active surface, and a plurality of side surfaces, the active surface having a plurality of I/O pads formed thereon, wherein the die is positioned over the top surface of the die attach pad such that selected edge regions of the bottom surface of the die overhang the recessed region;
   an adhesive that adhesively bonds the bottom surface of the die to the die attach pad, wherein the adhesive extends along the entire bottom surface of the die and a portion of the adhesive extends into the recessed region and fills the entire portion of the recessed region that directly underlies the bottom surface of the die overhang regions such that a thickness of the adhesive at the overhanging edge regions of the bottom surface of the die is thicker than a thickness of the adhesive at the central region; and a molding material distinct from the adhesive that encapsulates the die and at least portions of lead frame.

2. The integrated circuit package as recited in claim 1, wherein the recessed region is recessed to a depth in the range of approximately 12 to 100 microns relative to the central region of the die attach pad.

3. The integrated circuit package as recited in claim 1, wherein the recessed region is recessed to a depth in the range of approximately 25 to 75 percent of the die attach pad thickness at the central region of the die attach pad.

4. The integrated circuit package as recited in claim 1, wherein the recessed region takes the form of a single trough that extends below and along all side surfaces of the die.

5. The integrated circuit package as recited in claim 1, wherein the recessed region extends to side edges of the die attach pad.

6. An integrated circuit package, comprising:
a lead frame including a multiplicity of leads and a die attach pad, the die attach pad having a top surface and a bottom surface, wherein the top surface of the die attach pad has a central die attach region, a trough and a peripheral recessed region that are both lower than the central die attach region, wherein the peripheral recessed region extends substantially around the periphery of the die attach pad and is separated from the trough by a feature having the same height as the central die attach region;
a die including an active surface, a bottom surface substantially opposite the active surface, and a plurality of side surfaces, the active surface having a plurality of I/O pads formed thereon, wherein the die is positioned over the top surface of the die attach pad such that selected edge regions of the bottom surface of the die overhang the trough along all side surfaces of the die; and
an adhesive that adhesively bonds the bottom surface of the die to the die attach pad, wherein a portion of the adhesive extends into the first recessed region such that a thickness of the adhesive at the overhanging edge regions of the bottom surface of the die is thicker than a thickness of the adhesive at the central region; and
wherein at least one of the I/O pads on the die is electrically connected by a bonding wire attached to the die attach pad in the peripheral recessed region.

7. The integrated circuit package as recited in claim 1, further comprising bonding wires that electrically connect selected I/O pads on the active surface of the die to selected top surfaces of the leads.

8. The integrated circuit package as recited in claim 7, further comprising bonding wires that electrically connect selected I/O pads on the active surface of the die to selected portions of the die attach pad.

9. The integrated circuit package as recited in claim 7, further comprising a molding material that encapsulates the die, bonding wires and at least portions of the leads and die attach pad.

10. The integrated circuit package as recited in claim 1, wherein a peripheral portions of the adhesive form fillets within the recessed region that extend peripherally beyond the die.

11. The integrated circuit package as recited in claim 10, wherein the fillets extend peripherally beyond the die to a land structure that is formed between the outer edges of the die attach pad and the recessed region.

12. The integrated circuit package as recited in claim 6, wherein the adhesive extends along the entire bottom surface of the die and fills the entire portion of the recessed region that directly underlies the bottom surface of the die overhang regions.

13. The integrated circuit package as recited in claim 6, wherein a peripheral portions of the adhesive form fillets within the first recessed region that extend peripherally beyond the die.

14. The integrated circuit package as recited in claim 6 further comprising a land structure that separates the first recessed region from the second peripheral recessed region, first recessed region.

15. The integrated circuit package as recited in claim 14, wherein fillets from along the peripheral portion of the adhesive that extend between the die side surfaces and the land structure.

16. The integrated circuit package as recited in claim 6, wherein at least a portion of a bottom surface of the second peripheral recessed regions is metallic thin film plated to facilitate down bonding that electrically connects the die to the die attach pad.

* * * * *